(12) United States Patent
Chang et al.

(10) Patent No.: US 11,601,156 B2
(45) Date of Patent: Mar. 7, 2023

(54) APPARATUS AND METHODS FOR IMPROVED TRANSMIT POWER

(71) Applicant: MediaTek Inc., Hsin-Chu (TW)

(72) Inventors: Yu-Hsien Chang, Hsinchu (TW); Po-Chun Huang, Hsinchu (TW); Pi-An Wu, Hsinchu (TW); Wen-Hsien Chiu, Hsinchu (TW); Tzu-Wen Sung, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 17/353,351

(22) Filed: Jun. 21, 2021

(65) Prior Publication Data
US 2022/0014227 A1    Jan. 13, 2022

Related U.S. Application Data

(60) Provisional application No. 63/048,368, filed on Jul. 6, 2020.

(51) Int. Cl.
*H04B 1/403* (2015.01)
*H03L 7/089* (2006.01)
(Continued)

(52) U.S. Cl.
CPC ........... *H04B 1/403* (2013.01); *H03L 7/0891* (2013.01); *H03L 7/099* (2013.01); *H04L 7/033* (2013.01)

(58) Field of Classification Search
CPC ....... H04B 1/403; H03L 7/0891; H03L 7/099; H04L 7/033
See application file for complete search history.

(56) References Cited

U.S. PATENT DOCUMENTS

| | | |
|---|---|---|
| 5,420,545 A | 5/1995 | Davis et al. |
| 6,624,668 B1 | 9/2003 | Robinson et al. |

(Continued)

FOREIGN PATENT DOCUMENTS

| | | | | |
|---|---|---|---|---|
| EP | 3937380 A1 | * | 1/2022 | ........... H03L 7/0891 |
| JP | 2022517453 A | * | 3/2022 | |

(Continued)

OTHER PUBLICATIONS

Extended European Search Report dated Nov. 30, 2021 in connection with European Application No. 21183891.7.

(Continued)

*Primary Examiner* — Adam D Houston
(74) *Attorney, Agent, or Firm* — Wolf, Greenfield & Sacks, P.C.

(57) ABSTRACT

Disclosed herein are devices and methods to reduce unwanted CIM3 emission in a wireless communication device, such that the transmit (TX) power level applied in a RU can be increased without exceeding a regulatory emission requirement. In some aspects, unwanted emission may be reduced by shifting or changing local oscillator (LO) frequencies during TX operation. Some embodiments are directed to a fast-locking PLL with adjustable bandwidth that can be controlled to increase the PLL bandwidth during the RX to TX transition to provide a fast locking to a new LO frequency. Some aspects are directed to configuring an LO frequency shift amount for different RUs when multiple RUs are allocated within a frequency band.

23 Claims, 14 Drawing Sheets

(51) Int. Cl.
   *H03L 7/099*   (2006.01)
   *H04L 7/033*   (2006.01)

(56) References Cited

U.S. PATENT DOCUMENTS

| | | | | |
|---|---|---|---|---|
| 8,022,849 | B2* | 9/2011 | Zhang | H03L 7/1976 |
| | | | | 341/142 |
| 9,438,249 | B1* | 9/2016 | Nguyen | H03L 7/099 |
| 9,991,897 | B1* | 6/2018 | Park | H03L 7/099 |
| 10,116,290 | B1* | 10/2018 | Wang | H03L 7/093 |
| 10,291,242 | B1* | 5/2019 | Elbadry | H03L 7/099 |
| 10,419,046 | B2 | 9/2019 | Chen et al. | |
| 11,095,427 | B1* | 8/2021 | Banin | H03C 3/00 |
| 11,387,833 | B1* | 7/2022 | Li | G04F 10/005 |
| 11,418,199 | B1* | 8/2022 | Cherniak | H03L 7/087 |
| 2011/0136443 | A1* | 6/2011 | Milenkovic | H03M 7/3033 |
| | | | | 455/75 |
| 2015/0381190 | A1 | 12/2015 | Goyal et al. | |
| 2016/0254817 | A1* | 9/2016 | Vahid Far | H03L 7/0802 |
| | | | | 327/157 |
| 2017/0238232 | A1 | 8/2017 | Yang et al. | |
| 2017/0338940 | A1 | 11/2017 | Zanuso et al. | |
| 2018/0034621 | A1* | 2/2018 | Hueber | H04L 7/033 |
| 2018/0241379 | A1* | 8/2018 | Murphy | H03K 3/0315 |
| 2019/0215000 | A1* | 7/2019 | Jin | H03L 7/0995 |
| 2019/0235445 | A1* | 8/2019 | Han | G04F 5/14 |
| 2020/0336168 | A1* | 10/2020 | Hormis | H03L 7/22 |
| 2021/0135832 | A1* | 5/2021 | Ly | H04L 27/2605 |
| 2021/0203331 | A1* | 7/2021 | Finocchiaro | H03L 7/23 |
| 2021/0297296 | A1* | 9/2021 | Syllaios | H04B 1/403 |

FOREIGN PATENT DOCUMENTS

| | | |
|---|---|---|
| TW | 200637205 A | 10/2006 |
| TW | 201032463 A | 9/2010 |
| WO | WO 97/40586 A1 | 10/1997 |
| WO | WO 2019/005828 A1 | 1/2019 |

OTHER PUBLICATIONS

Wadekar et al., A 0.5-4GHz Programmable-Bandwidth Fractional-N PLL for Multi-protocol SERDES in 28nm CMOS. 2016 29th International Conference on VLSI Design and 2016 15th International Conference on Embedded Systems (VLSID) Jan. 4, 2016:236-39.

* cited by examiner

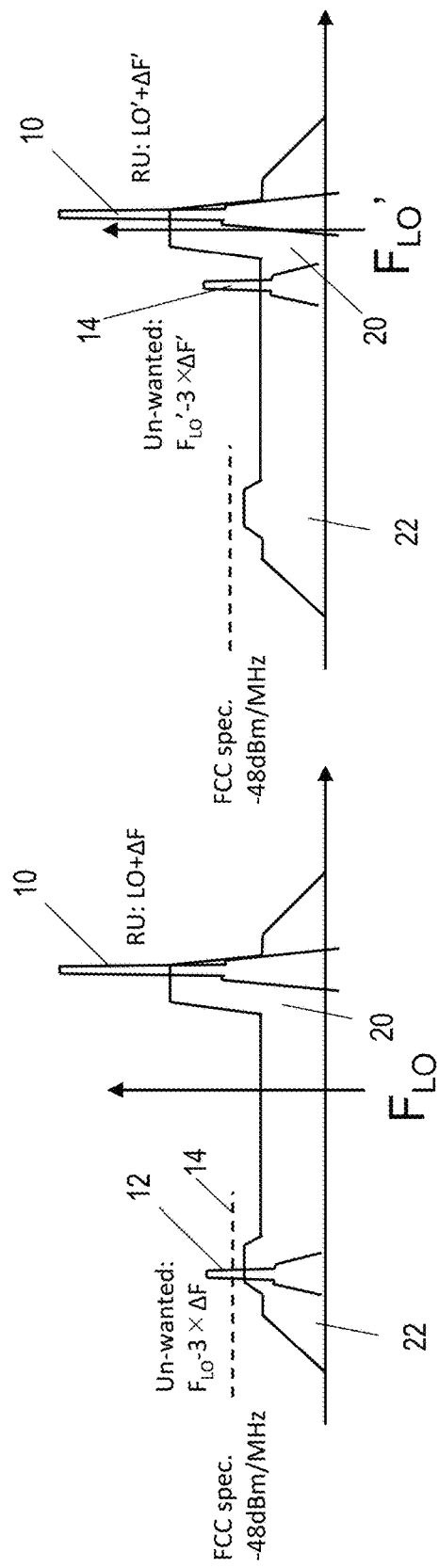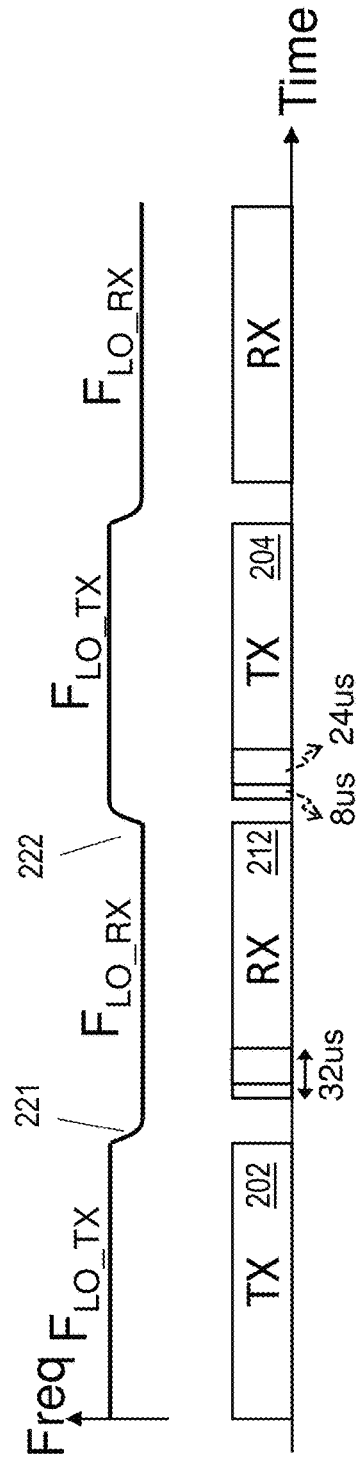
FIG. 1A
FIG. 1B
FIG. 2

FIG. 11

APPARATUS AND METHODS FOR IMPROVED TRANSMIT POWER

CROSS-REFERENCE TO RELATED APPLICATIONS

This application claims the benefit under 35 U.S.C. 119(e) of U.S. Patent Application Ser. No. 63/048,368, filed Jul. 6, 2020, entitled "11AX OFDMA CIM3/HD3 SOLUTION," which is hereby incorporated herein by reference in its entirety.

BACKGROUND

The present application relates generally to methods and apparatus for wireless communication. In particular, it relates to wireless transmission that uses a Wi-Fi network.

Wireless networks employ radio frequency (RF) waves to permit communication between wireless communication devices over a distance without the constraint of wire-based communication systems. In a typical wireless communication device, a transmitter takes an RF input signal containing information such as voice or data and formats the RF input signal into an appropriate RF radio signal in a predetermined frequency band for transmission by one or more RF antennas. In the transmitter, the RF input signal may be an intermedia frequency (IF) signal having frequency $F_{IF}$, which is mixed with a local oscillator (LO) signal having frequency $F_{LO}$ in a mixer to generate the RF radio signal having a carrier frequency $F_{RF}$ for transmission. A wireless communication device may have a receiver, and often has a transceiver that includes both a transmitter and a receiver within one package. In the receiver, received and amplified RF radio signal is mixed in a mixer with the LO signal to extract the RF input signal (sometimes also called a baseband signal) which can be further demodulated to reproduce the information conveyed therein.

In a Wi-Fi network, wireless communication devices communicate data wirelessly via for example a wireless access point (AP) or in an ad-hoc fashion within range of the Wi-Fi network. A wireless communication device may be portable and able to draw power from a mobile power source such as rechargeable or replaceable battery without tethered to an electric network for power or data communication.

Wi-Fi signals in a Wi-Fi network may be communicated under an 802.11 protocol. In some Wi-Fi networks, Wi-Fi signals are transmitted under orthogonal frequency-division multiple access (OFDMA) transmission, in which subsets of subcarrier frequency bands are assigned to different users.

In OFDMA transmission such as that specified in 802.11ax, subsets of time-frequency resources are allocated to allow simultaneous data transmission from multiple users. For example, wide channels (20 MHz, 40 MHz, 80 MHz, 80+80 MHz and 160 MHz) specified in 802.11ac may be sub-divided into groups of subcarriers ("tones") with OFDMA. Adjacent tones are grouped together into a resource unit (RU), and a sender can choose the best RU for each particular receiver to reduce interference and improve signal to noise ratio (SNR). An RU can contain 26, 52, 106, 242, 484, 996 or 2×996 tones. Each wide RU can be split into two approximately twice-narrower RUs. The 20 MHz band, 40 MHz band, 80 MHz band and 80+80 (160) MHz band corresponds to a 242-tone RU, 484-tone RUs, 996-tone RUs and two 996-tone RUs, respectively. For example, for a 20 MHz bandwidth, nine 26-tone RUs can be used, while four 52-RUs can alternatively be used.

SUMMARY

Disclosed herein are devices and methods to reduce unwanted CIM3 emission in a wireless communication device, such that the transmit (TX) power level applied in a RU can be increased without exceeding a regulatory emission requirement. In some aspects, unwanted emission may be reduced by shifting or changing local oscillator (LO) frequencies during TX operation. Some embodiments are directed to a fast-locking PLL with adjustable bandwidth that can be controlled to increase the PLL bandwidth during the RX to TX transition to provide a fast locking to a new LO frequency. Some aspects are directed to configuring an LO frequency shift amount for different RUs when multiple RUs are allocated within a frequency band.

According to some embodiments, a method for operating a device for wireless communication in a plurality of allocated resource units (RUs) within a frequency band is disclosed. The method comprises for one or more RUs of the plurality of RUs: receiving a receive (RX) signal in the RU and demodulating the RX signal with a local oscillator (LO) signal; changing a frequency of the LO signal; and subsequent to changing the frequency of the LO signal, modulating a transmit (TX) data packet for transmission with the LO signal.

According to some embodiments, an apparatus for wirelessly transmitting a transmit (TX) signal during a TX period and wirelessly receiving a receive (RX) signal during a RX period is disclosed. The apparatus comprises a phase-locked loop (PLL) configured to generate an oscillator (LO) signal; and a controller coupled to the PLL and configured to change a frequency of the LO signal during a transition between the RX period and the TX period. The RX signal is demodulated with the LO signal and the TX signal is modulated with the LO signal.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIG. 1A is a schematic frequency domain diagram illustrating unwanted emission due to nonlinear intermodulation products;

FIG. 1B is a schematic frequency domain diagram illustrating a shift in LO frequency during TX operation, in accordance with some embodiments;

FIG. 2 is a timing diagram illustrating the LO frequency during transitions between RX and TX operations in a wireless communication device, in accordance with some embodiments;

FIG. 11 is a listing of TX LO frequency shift or offset amount that can be configured for the channels allocated for 160 Hz bandwidth as shown in FIG. 10, in accordance with some embodiments.

DETAILED DESCRIPTION

Figure 3:
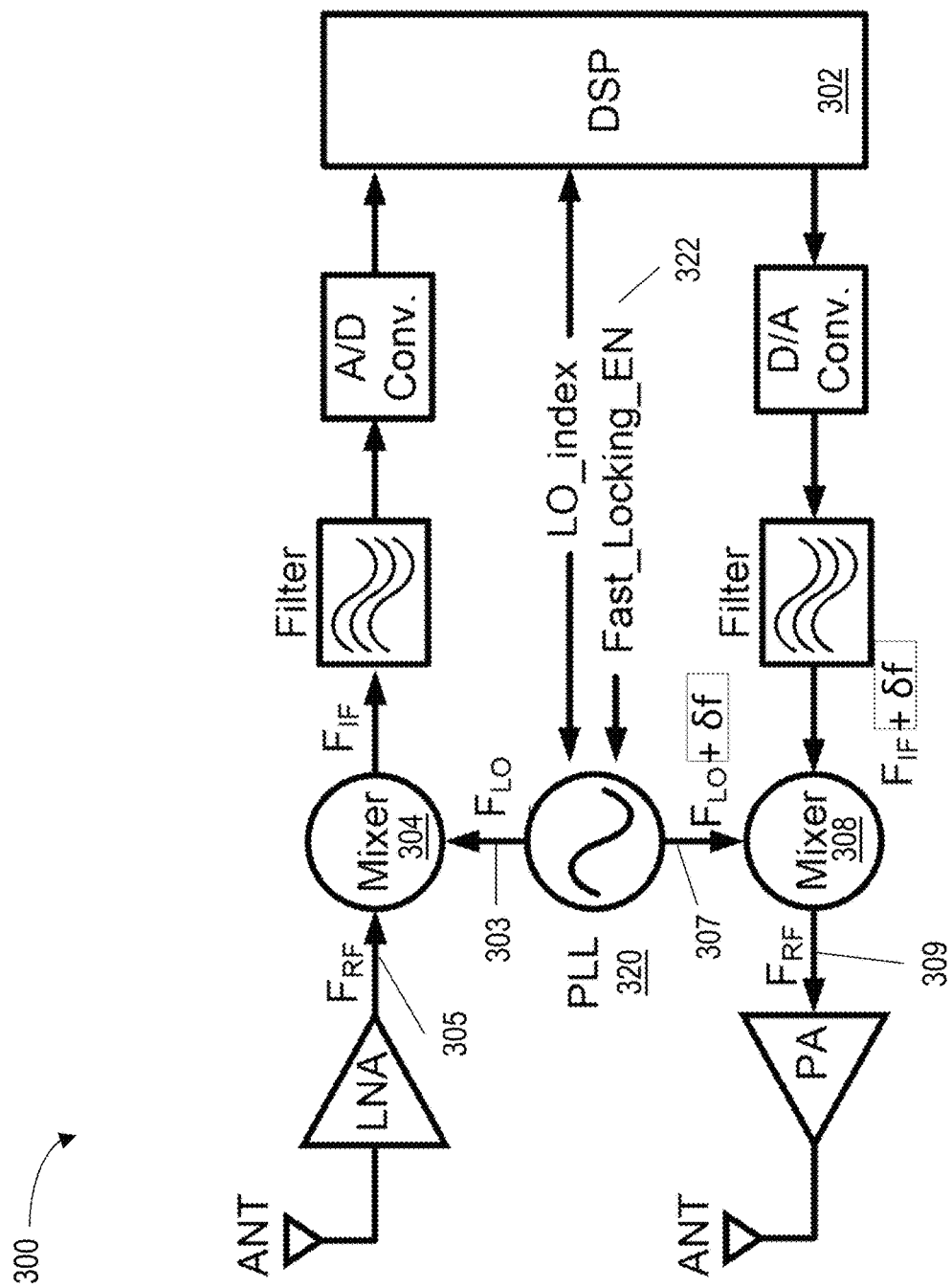
FIG. 3 is a schematic diagram of components in a wireless communication device 300 having a fast-locking PLL, in accordance with some embodiments.

A wireless signal may have unwanted emissions on a frequency or frequencies outside the necessary bandwidth allocated for transmission of the wireless signal. The power level of unwanted emissions is subject to regulatory emission requirements by, for example, the Federal Communications Commission (FCC). Under protocols such as Wi-Fi 802.11ax, a user is allocated a RU with a dedicated narrow bandwidth for signal transmission. The transmitted power is aggregated within the allocated bandwidth using a linear transmitter and harmonic-rejection mixers. Still, there could be unwanted emissions with a power level that violates FCC emission specifications. For example, while OFDMA allows different transmit (TX) powers to be applied to different RUs, increasing TX power for a RU may lead to an increase of unwanted emissions caused by, for example, 3rd-order counter-intermodulation products (CIM3) due to 3rd-order nonlinearity in a transmitter. As a result, TX power for a RU may be limited to avoid exceeding an emission requirement.

Disclosed herein are devices and methods to reduce CIM3 emission in a wireless communication device, such that the TX power level applied in a RU can be increased without exceeding the emission requirement. As a result of the increased Tx power level, higher transmission efficiency, accuracy and range may be achieved by the wireless communication device.

In some aspects of the present application, unwanted emission may be reduced by shifting or changing local oscillator (LO) frequencies between transmit (TX) and receive (RX) operation, such that different LO frequencies are used for modulation/demodulation of a RX signal and a TX signal. The inventors have recognized and appreciated that by changing the LO frequency between TX and RX packets, unwanted CIM3 emission may be reduced. For example, CIM3 emissions may be reduced if the LO frequency is shifted to align with the RU frequency.

During high data rate wireless communication, it is desirable to complete the change in LO frequency within a short amount of time to avoid disruption to continuing RX and TX operations. Some aspects of the present application are directed to a fast-locking phase locked loop (PLL) in the wireless communication device that can be controlled to rapidly change an LO frequency during a transition between a RX period and a TX period. In some embodiments, the fast-locking PLL has an adjustable bandwidth, and is controlled to first increase the PLL bandwidth prior to changing the LO frequency to allow a faster locking during the transition to the new LO frequency. After locking, the PLL bandwidth may be lowered back to the normal level to maintain accuracy of the PLL. In some embodiments, the change of LO frequency may be achieved for example within 5 μs or within 2 μs.

The PLL with adjustable bandwidth for changing the LO frequency can be implemented in a number of ways as described in detail below. Briefly, in some embodiments, a charge pump current in the PLL may be changed to adjust the bandwidth. In some embodiments, impedance and/or capacitance RC values between a reference voltage node and a voltage-controlled oscillator (VCO) may be adjusted to select the bandwidth. In some embodiments, bandwidth may be adjusted by employing a change of N-ratio of a divider in the PLL. In yet some other embodiments, reference pulses to the PLL may be modified to have higher rate of pulses.

Yet some other aspects are directed to a method of configuring an LO frequency shift amount for different RUs when multiple RUs are allocated within a frequency band. The inventors have recognized and appreciated that with multiple RUs, it is not necessary for each RU to have the same amount of LO frequency shift during a transition from RX to TX. For certain RUs, it may be desirable to have a higher amount of LO frequency shift, or no LO frequency shift at all to reduce emission. In some embodiments, the amount of LO frequency shift may be different for different channels. For example, a RU closer to an edge of the frequency band may have a higher magnitude of LO frequency shift to improve emission performance.

FIG. 1A is a schematic frequency domain diagram illustrating unwanted emission due to nonlinear intermodulation products. FIG. 1A illustrates frequency bands 20 and 22, and a RU 10 for either RX or TX in frequency band 20. Because of 3rd order harmonics in the transceiver circuitry, unwanted emission 12 appears at a frequency range lower than the LO frequency $F_{LO}$. Specifically, for CIM3 the unwanted emission 12 is centered at $F_{LO}-3\times\Delta F$, where $\Delta F$ is the intermediate frequency (IF) between $F_{LO}$ and the center RF frequency of the RU 10. As the TX power level in frequency band 20 is increased, power level for unwanted CIM3 emission 12 also increases, and may risk exceeding an emission requirement 14 at a nearby band 22. As a result, TX power level cannot be increased beyond a maximum level due to the constraint of the emission requirement. An object of the present application is to reduce the effect of CIM3 emission to allow TX power level to be further increased beyond the maximum level permitted in the scenario in FIG. 1A.

FIG. 1B is a schematic frequency domain diagram illustrating a shift in LO frequency during TX operation, in accordance with some embodiments. In FIG. 1B, the LO frequency is shifted higher to $F_{LO}'$ to be closer to the center frequency of RU 10. Meanwhile, the IF is reduced accordingly to $\Delta F'$ such that the RF frequency of the RU is maintained. As a result, the unwanted emission 14 is centered at $F_{LO}'-3\times\Delta F'$ which is away from band 22 and the emission at band 22 as shown in FIG. 1A is eliminated. Therefore shifting LO frequency during TX may help relax the TX CIM3 requirement and allow an increase of TX power level.

It should be appreciated that while in the example in FIG. 1B $F_{LO}$ shifts by a positive amount, it is not a requirement and in some embodiments the amount of shift to TX $F_{LO}$ may be negative, for example when $F_{LO}$ is situated to the right of the center frequency of the RU. It should also be appreciated that while CIM3 emission is illustrated as an example, other unwanted emissions from non-linear mixing or other mechanisms may also be present and may benefit from aspects of the shifting TX LO frequency disclosed herein.

FIG. 2 is a timing diagram illustrating the LO frequency during transitions between RX and TX operations in a wireless communication device, in accordance with some embodiments. In FIG. 2, the LO frequency shifts from $F_{LO\_TX}$ at TX period 202 to a different value $F_{LO\_RX}$ at RX period 212 during a first transition 221, and shifts to $F_{LO\_TX}$ during a second transition 222 from RX period 212 to TX period 204. During the RX period, the device receives a RX signal in one RU of one or more RUs, and demodulates the RX signal based on an LO signal having $F_{LO\_RX}$, for example by mixing the received RX signal with the LO signal. During the TX period, the device modulates a TX data packet based on based on an LO signal having $F_{LO\_TX}$ that is shifted from $F_{LO\_RX}$, for example by mixing the data packet with the LO signal prior for transmission. As a result of the shifted LO signal during TX period, unwanted emissions such as the CIM3 emissions may be reduced and the maximum TX power level can be increased without offending the CIM3 emission requirements.

The inventors have recognized and appreciated that to prevent interruption to data transmission during wireless communication, the period of time it takes to transition between $F_{LO\_RX}$ and $F_{LO\_TX}$ as shown in FIG. 2 needs to be minimized. According to one aspect, a fast-locking PLL is provided having means for completing the shifting of LO frequency and locking to a new LO frequency within a time duration of no more than 5 μs, no more than 2 μs, no more than 1 μs, or between 1 and 10 μs. In some embodiments, the PLL is controlled to perform a "gear shift" to a higher bandwidth during the LO frequency transition to allow a fast locking, and a subsequent gear shift back to a lower, normal bandwidth after locking to the new LO frequency to integrated phase noise.

FIG. 3 is a schematic diagram of components in a wireless communication device 300 having a fast-locking PLL, in accordance with some embodiments. In device 300, PLL 320 generates an LO signal 303 having LO frequency $F_{LO}$ which is mixed with a received RF signal 305 at mixer 304. PLL 320 generates a LO signal 307 having a shifted LO frequency $F_{LO}+\delta f$. Mixer 308 mixes LO signal 307 with an IF signal to generate RF signal 309 for transmission.

TABLE 1

|  | RX mode | TX mode |
| --- | --- | --- |
| LO frequency | $F_{LO}$ | $F_{LO} + \delta f$ |
| IF frequency | $F_{IF}$ | $F_{IF} - \delta f$ |
| RF frequency | $F_{RF}$ | $F_{RF}$ |

In FIG. 3, PLL 320 is controlled by a controller 302 to change the L frequency between RX and TX modes in accordance with Table 1. Table 1 summarizes the LO frequency, IF frequency, and RF frequency during operation of device 300, in accordance with some embodiments. During transition from RX mode to TX mode, PLL 320 is controlled by controller 302 to change $F_{LO}$ by an amount of δf to reduce unwanted emissions as described elsewhere in this disclosure. Correspondingly, device 300 will change the IF frequency by −δf using suitable techniques known to a person of ordinary skill in the art such that the combined RF frequency for TX remains the same at $F_{RF}$. It should be appreciated that δf may be of any reasonable amount, and can be either positive (to increase $F_{LO}$) or negative (to decrease $F_{LO}$).

FIG. 3, which shows controller 302 coupled to PLL 320 with a control data path 322. In some embodiments, the changing of LO frequency by PLL 320 may be controlled in response to control signals transmitted from controller 302 in control data path 322. FIG. 3 illustrates an example in which a control signal "LO_index" is used to specify the LO frequency shift amount of for a given channel or RU. A control signal "Fast_Locking_EN" is used to trigger the PLL to switch into a fast locking mode to allow a faster time to lock into the new LO frequency. In some embodiments, the PLL increases its bandwidth in the fast locking mode, and restores the PLL bandwidth to a normal, lower level upon completion of the locking. While not shown, it should be appreciated that additional or different control signals and/or parameter data may be transmitted in control data path 322 to control operation of PLL 320.

Controller 302 may comprise any suitable logic, processors and/or memory elements, and may include any suitable processing device such as but not limited to a central processing unit (CPU), digital signal processor (DSP), addressable controller, general or special purpose microprocessor, microcontroller, addressable microprocessor, programmable processor, programmable controller, dedicated processor, dedicated controller, or any other suitable processing device. Some or all components within controller 302 may be packaged as a system-on-a-chip (SOC), which in some embodiments may include PLL 320 and other components as shown in FIG. 3. Moreover, it should be appreciated that FIG. 3 is a simplified representation of a controller 302. An actual implementation of a controller 302 may comprise separate circuitry for processing RX and TX data, as well as sending and receiving data and control signals to components such as PLL 320.

Controller 302 may comprise a non-transitory computer-readable storage medium that may include, for example, volatile and/or non-volatile memory. The non-transitory computer-readable storage medium may store one or more instructions such as but not limited to a firmware to program the one or more processors to perform any of the methods or processes described herein. In some examples, the components disclosed herein may read parameters that affect the functions performed by the components. These parameters may be physically stored in any form of suitable memory including volatile memory (such as RAM) or nonvolatile memory (such as but not limited to flash memory, EPROM or EEPROM). In addition, the parameters may be logically stored in a propriety data structure (such as a database or file defined by a user space application) or in a commonly shared data structure (such as an application registry that is defined by an operating system). In addition, some examples provide for both system and user interfaces that allow external entities to modify the parameters and thereby configure the behavior of the components. The terms "code", "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention. Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments. The instructions may be persistently stored as encoded signals, and the instructions may cause the processor to perform any of the functions described herein.

Figure 4:
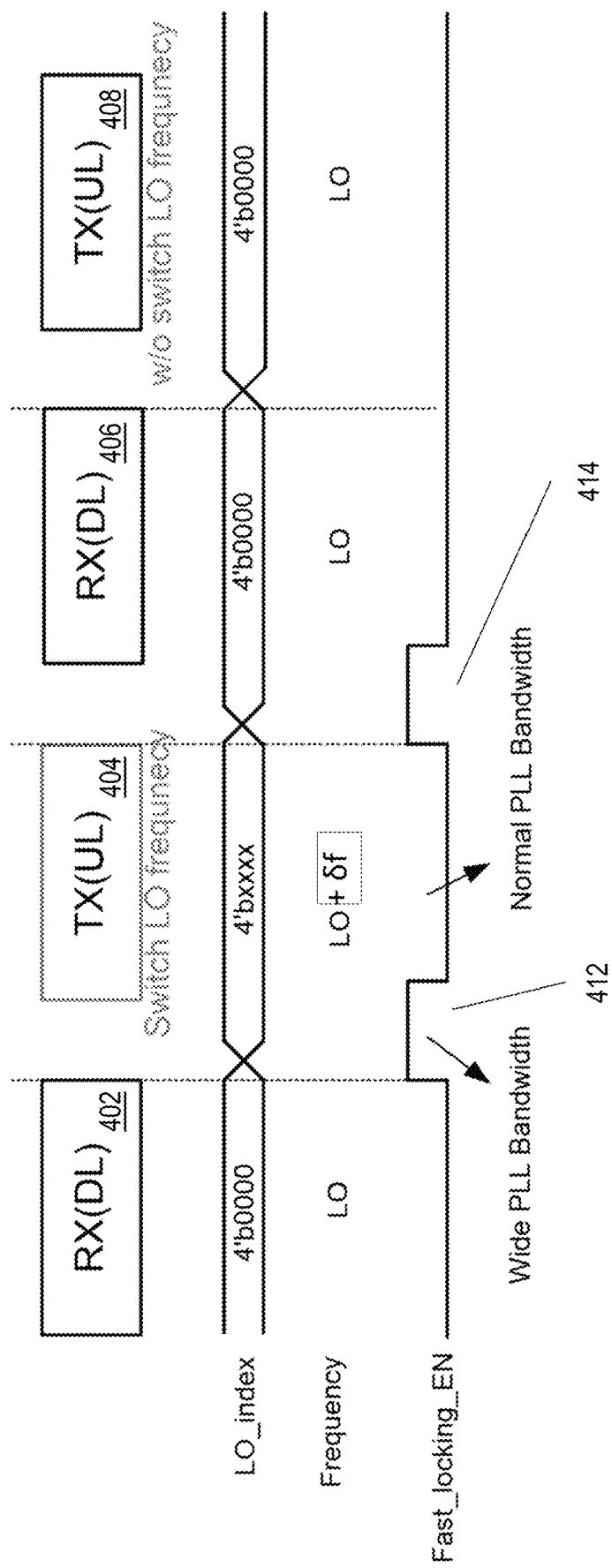
FIG. 4 is a series of timing diagrams illustrating an exemplary process of shifting LO frequency in a fast-locking PLL as shown in FIG. 3, in accordance with some embodiments.

FIG. 4 is a series of timing diagrams illustrating an exemplary process of shifting LO frequency in a fast-locking PLL as shown in FIG. 3, in accordance with some embodiments. FIG. 4 shows that a default LO frequency is indicated by LO_index of 4'b0000 for RX period 402. Upon transition to TX period 404, a shifted LO frequency with an LO frequency shift amount of δf is indicated by LO_index of 4'bxxxx, which restores back to the default LO frequency upon transition from TX period 404 to RX period 406. Period 408 is a TX period that is indicated as having a default LO frequency without changes. It should be appreciated that any suitable coding schemes may be used to program LO_index to indicate the amount of LO frequency. The bit length in LO_index and the type of information conveyed therein as shown in FIG. 4 is by way of example only and aspects of the present application are not so limited.

Still referring to FIG. 4, which shows Fast_locking_EN is used to trigger a change in PLL bandwidth during a transition between RX/TX periods to permit fast locking to a new LO frequency value. In particular, at the beginning of TX period 404, Fast_locking_EN changes polarity from low to high during a transition period 412 to indicate a switch to higher PLL bandwidth. Similarly, at the beginning of RX period 406, Fast_locking_EN changes polarity from high to low during a transition period 414 to indicate a switch back to lower PLL bandwidth. It should be appreciated that the low to high transition illustrated for Fast_locking_EN in periods 412, 414 is by way of example only and opposite polarity or any other suitable encoding may also be used.

Figure 5:
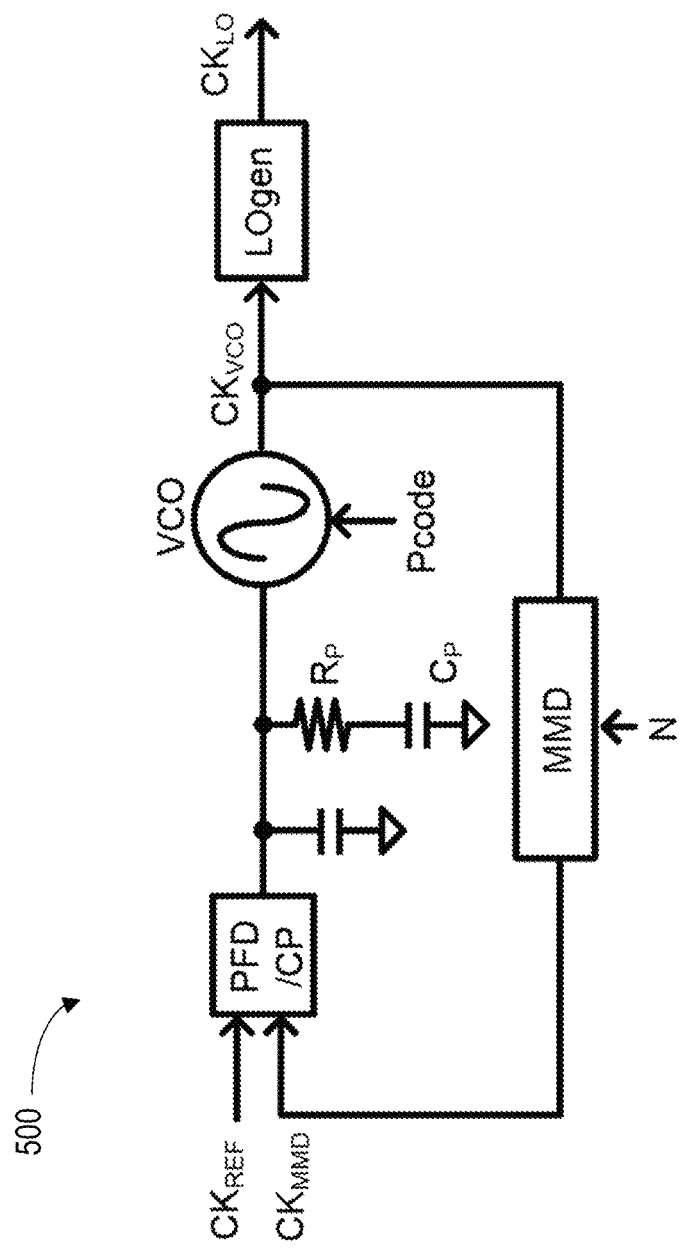
FIG. 5 is a schematic diagram of an exemplary fast-locking PLL 500, in accordance with some embodiments.

FIG. 5 is a schematic diagram of an exemplary fast-locking PLL 500, in accordance with some embodiments. PLL 500 includes a phase-frequency detector (PFD), a voltage-controlled oscillator (VCO), at least one charge pump (CP) coupled between the PFD and the VCO, an impedance Rp and a capacitance Cp coupled between ground and an input terminal to the VCO, and a multi-modulus divider (MMD) having a divider ratio N.

Figure 6:
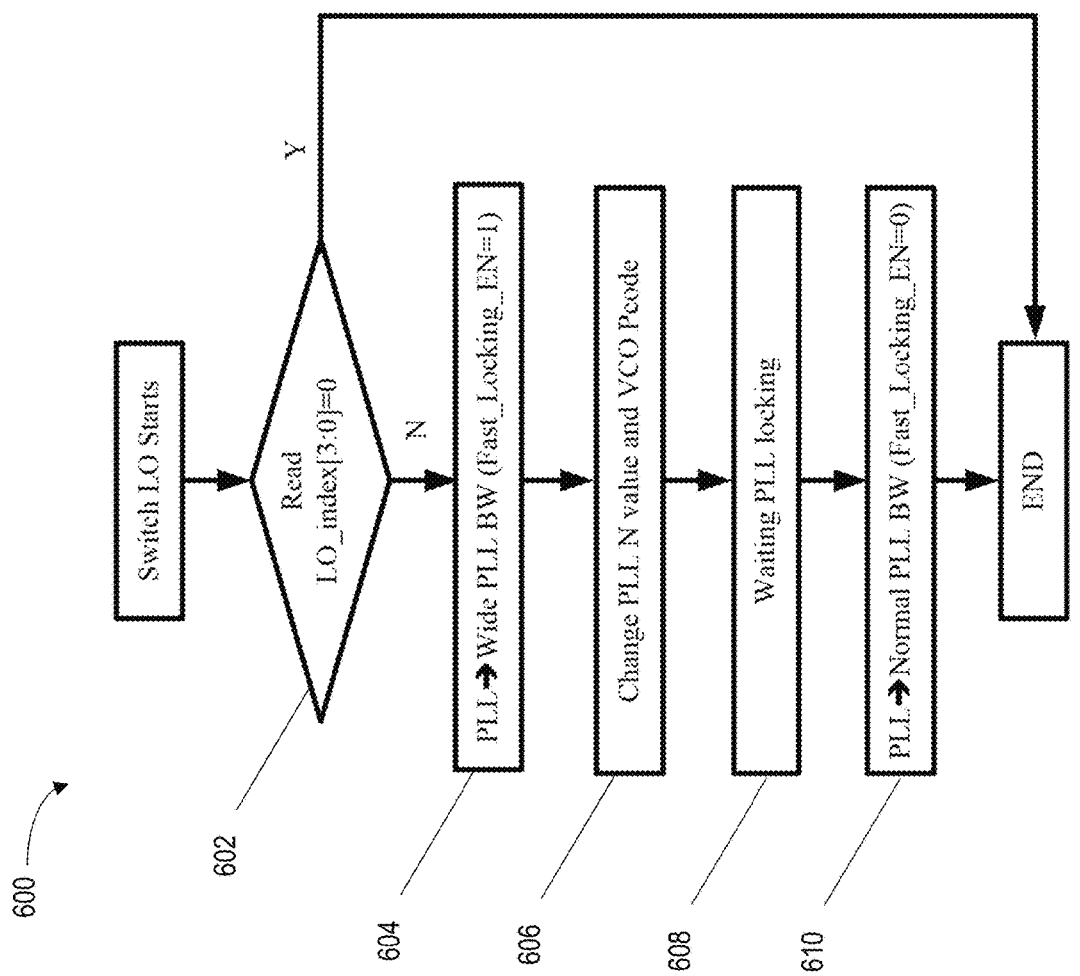
FIG. 6 is a schematic flow diagram illustrating a process 600 of controlling shifting LO frequency in the fast-locking PLL shown in FIG. 5, in accordance with some embodiments.

FIG. 6 is a schematic flow diagram illustrating a process 600 of controlling shifting LO frequency in the fast-locking PLL shown in FIG. 5, in accordance with some embodiments. At block 602 of process 600, a value of LO_index is read to decide if a switch in LO frequency should be performed. If the LO_index value is zero, process 600 ends. As a variation of process 600, block 602 may be omitted for a process that may proceed to begin with block 604 if there is no need to read an index to determine whether a change in LO frequency is called for.

If the value of LO_index calls for a change in LO frequency, at block 603 the Fast_Locking_EN is set to 1 to enable a wide PLL bandwidth. At block 606, PLL parameters such as but not limited to the PLL N value and a Pcode for VCO are changed to switch the LO frequency. Block 608 provides an appropriate wait time for the new LO frequency to be locked. At block 610, Fast_Locking_EN is set to 0 to disable the wide PLL bandwidth and restore the PLL bandwidth to a normal value.

It should be appreciated that while FIG. 4 and blocks 604, 610 of FIG. 6 illustrate examples of switching between a wide and a normal PLL bandwidth levels during the LO frequency switching operation, aspects of the present application is not limited to having binary bandwidth levels. For example, the PLL may have one or more intermediate bandwidth levels, and can be controlled to switch to a highest bandwidth, followed by one or more intermediate bandwidth, before restoring to a normal bandwidth level for fast locking to a new LO frequency.

FIGS. 7A-7D illustrate several exemplary implementations of a PLL with means to adjust a PLL bandwidth to provide fast-locking.

Figure 7A:
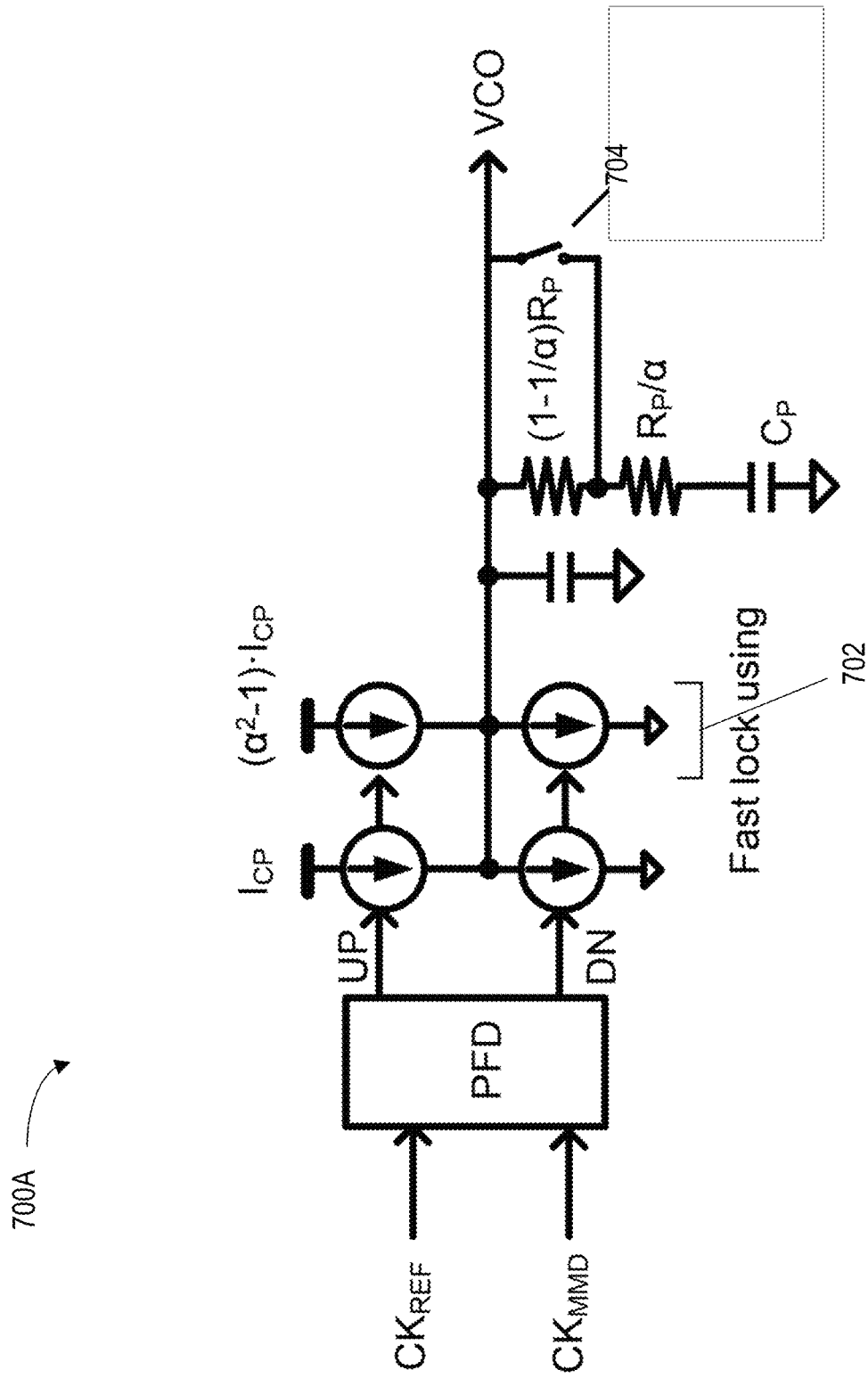
FIG. 7A, FIG. 7B, FIG. 7C, and FIG. 7D are schematic diagrams each illustrating an embodiments of a PLL with an adjustable bandwidth.

FIG. 7A is a schematic diagram illustrating a first embodiment of a PLL 700A with an adjustable bandwidth. As shown in FIG. 7A, PLL 700A comprises one or more programmable current sources 702 that can be controlled by a controller to increase or decrease a magnitude of a charge pump current $I_{CP}$. As the bandwidth $\omega_n = \sqrt{Icp*Kvco/N*Cp}$, an increase of $I_{CP}$ by a factor of $\alpha^2$ will result in an increase of bandwidth by a factor of $\alpha$. Programmable current sources 702 may be implemented with any suitable circuitry known in the field.

Meanwhile, the damping factor $\delta = Rp/2\sqrt{Icp*Kvco*Cp/N}$ is proportional to the square root of $I_{CP}$ and would have increased by a factor of $\alpha$ if $I_{CP}$ goes up by a factor of $\alpha^2$. To stabilize $\delta$ before and after the bandwidth is adjusted, a value for resistance $R_P$ as illustrated in FIG. 5 is also adjusted concurrently with the change to $I_{CP}$ to become $R_P/\alpha$ to maintain $\delta$ at a constant level. In FIG. 7A, $R_P$ is implemented as two serially connected resistances having values $R_P/\alpha$ and $(1-1/\alpha)R_P$, respectfully. A switch 704 is provided that can be controlled to short the $(1-1/\alpha)R_P$ resistance when $I_{CP}$ is increased by $\alpha^2$ to increase the PLL bandwidth, such that the effective resistance of $R_P$ is changed from a value of $R_P$ to $R_P/\alpha$ to maintain the damping factor. It should be appreciated that a programmable resistance $R_P$ may be implemented in any suitable ways known in the field, and not limited to the example illustrated in FIG. 7A.

Figure 7B:
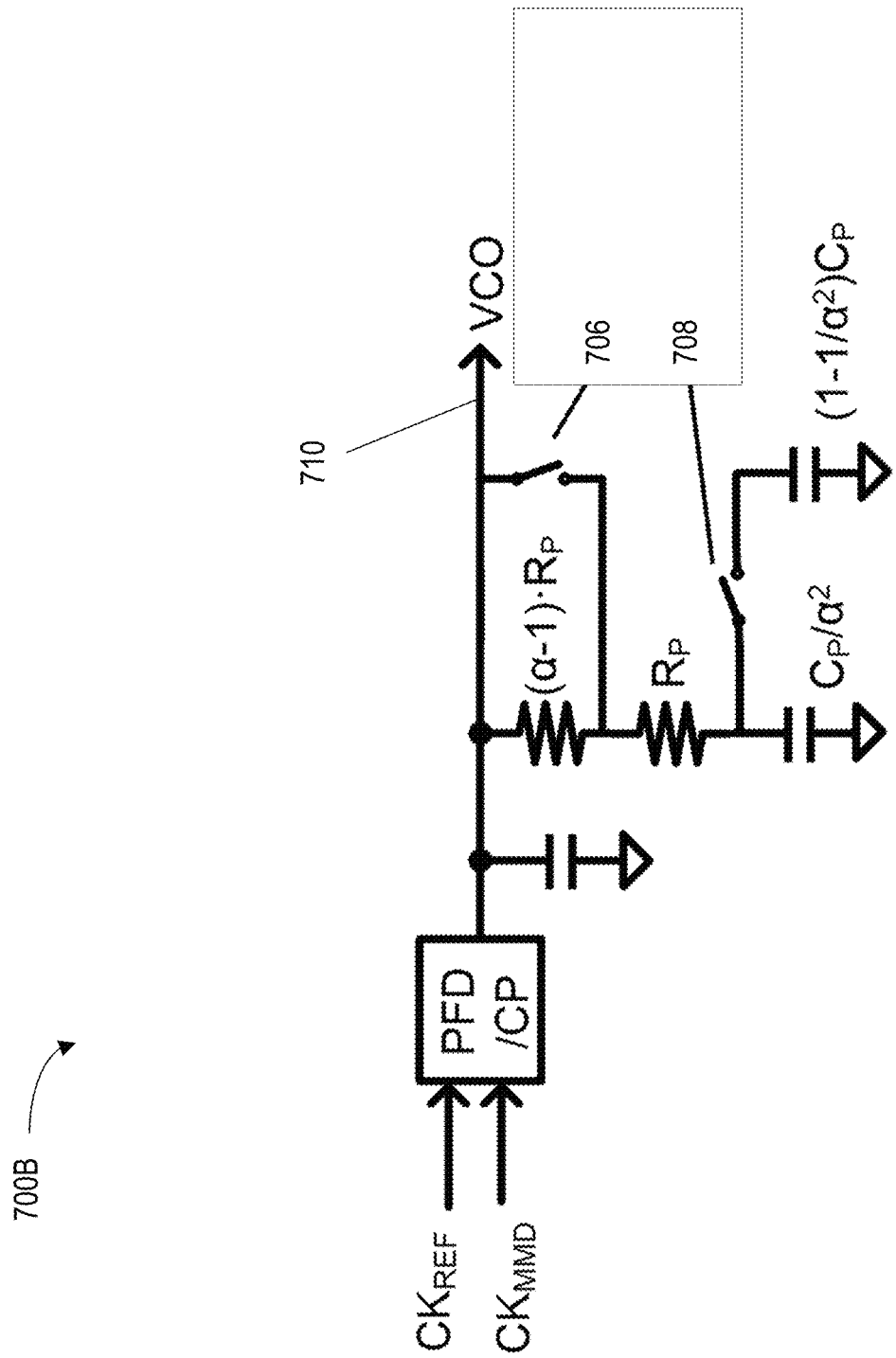

FIG. 7B is a schematic diagram illustrating a second embodiment of a PLL 700B with an adjustable bandwidth. In PLL 700B, the values of capacitance $C_P$ and impedance $R_P$ are adjusted concurrently to change the PLL bandwidth $\omega_n$ while stabilizing the damping factor $\delta$. In particular, when $C_P$ is changed to $C_P/\alpha^2$ and $R_P$ is changed to $\alpha \cdot R_P$, the bandwidth $\omega_n$ will become $\alpha \cdot \omega_n$ while the damping factor $\delta$ remains constant.

In FIG. 7B, a programmable capacitance is implemented by a first capacitance of $C_P/\alpha^2$ in parallel with a second capacitance of $(1-1/\alpha^2) \cdot C_P$. A programmable impedance is implemented by a first resistance of $(\alpha-1) \cdot R_P$ in series with a second resistance of $R_P$. A first switch 706 is coupled in parallel with the first resistance, and a second switch 708 is coupled in series between the top terminals of the first and second capacitances. Switches 706 and 708 are closed during a normal mode operation to yield an effective impedance of $R_P$ in series with $C_P$ between an input terminal 710 of the VCO and ground, such that the PLL has a first bandwidth $\omega_n$. When switches 706 and 708 are open, the bandwidth of the PLL becomes $\alpha \cdot \omega_n$. It should be appreciated that programmable $C_P$ and impedance $R_P$ may be implemented in any suitable ways known in the field and not limited to the example illustrated in FIG. 7B.

Figure 7C:
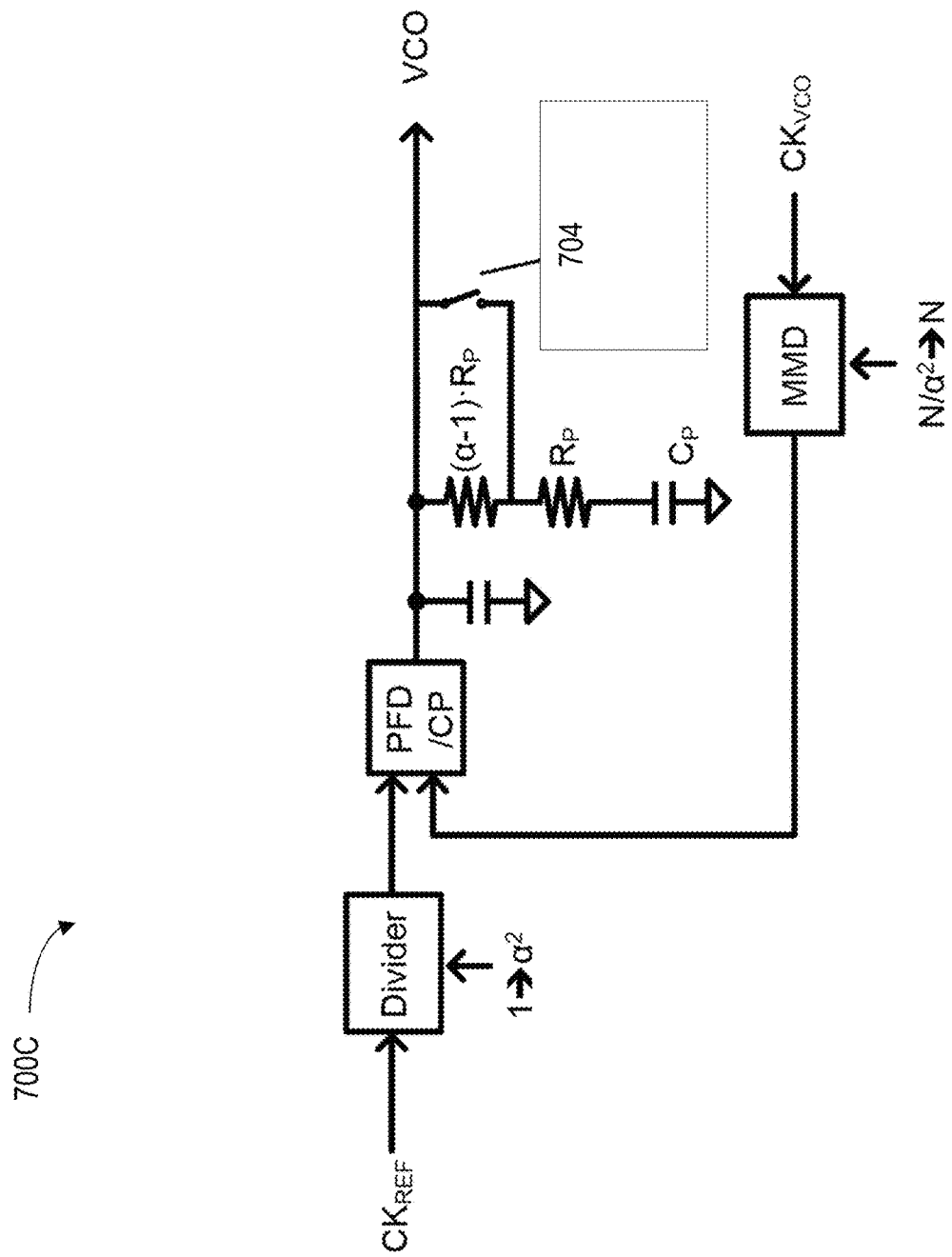

FIG. 7C is a schematic diagram illustrating a third embodiment of a PLL 700C with an adjustable bandwidth. In PLL 700C, bandwidth may be increased by changing the MMD N-ratio. For example, when N is changed to $N/\alpha^2$, the bandwidth $\omega_n$ becomes $\alpha \cdot \omega_n$. To stabilize the damping factor $\delta$, impedance $R_P$ may be adjusted to become $R_P/\alpha$, which may be accomplished by a switch 704 as described above in relation to FIG. 7A.

Figure 7D:
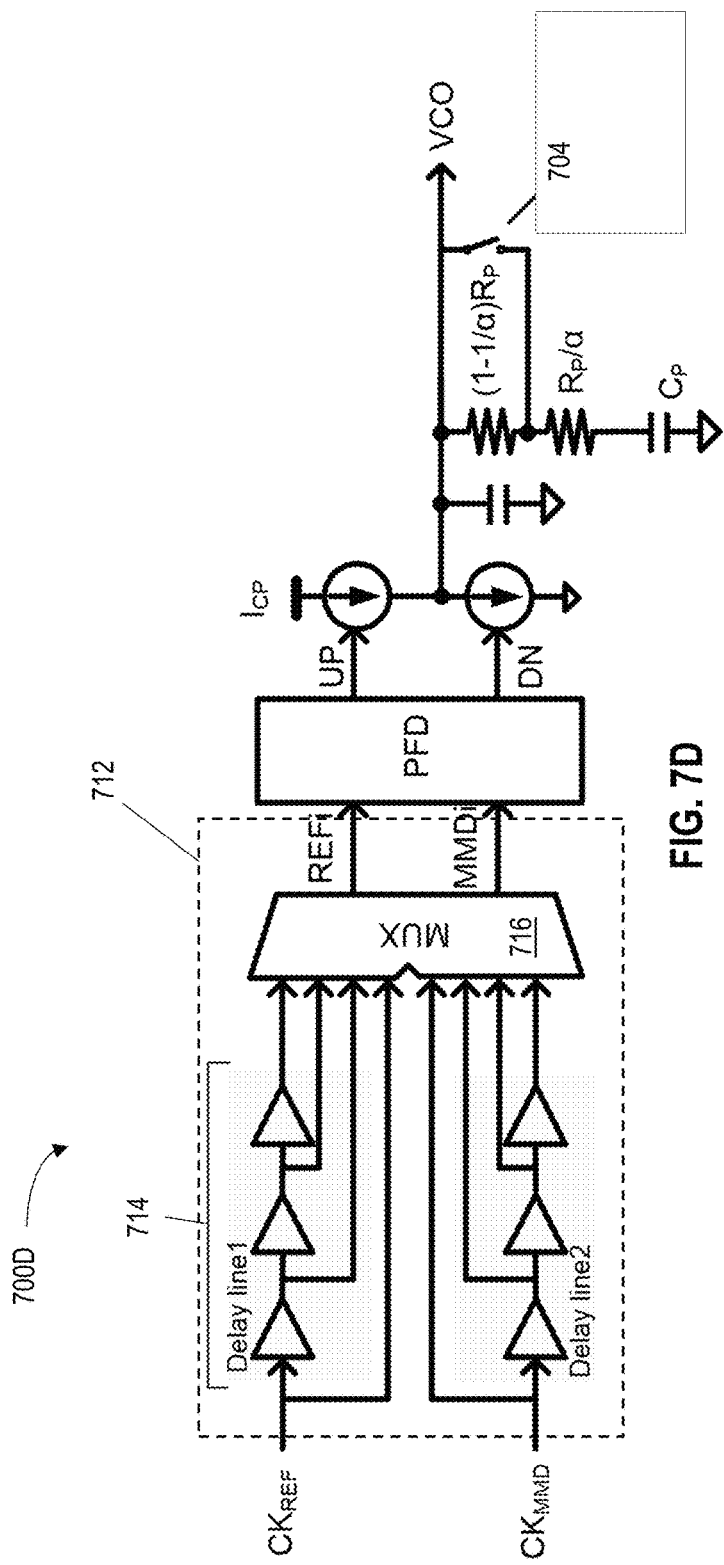

FIG. 7D is a schematic diagram illustrating a fourth embodiment of a PLL 700D with an adjustable bandwidth. Instead of increasing the charge pump current by adjusting the current sources like in FIG. 7A, PLL 700D provides a reference unit 712 that takes reference pulses $CK_{REF}$ and $CK_{MMD}$ as input and generates modified versions of $CK_{REF}$ and $CK_{MMD}$ having a higher rate of pulses to supply to the PFD in order to increase the bandwidth and to provide faster lock.

Figure 7E:
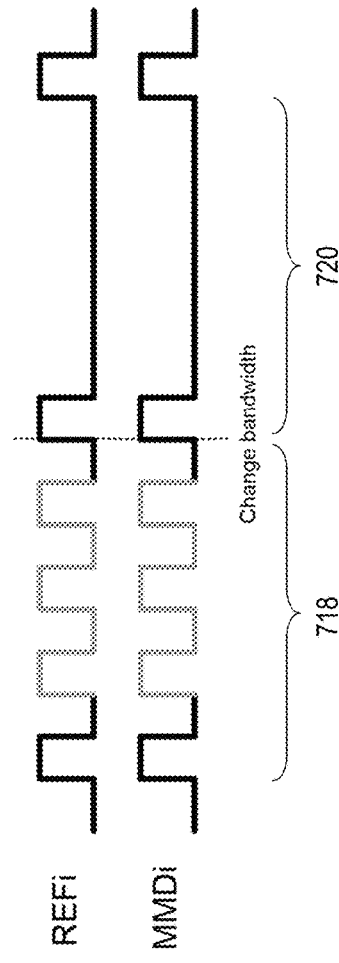
FIG. 7E is a schematic timing diagram of modified reference clocks as generated in the PLL of FIG. 7D, in accordance with some embodiments.

FIG. 7E is a schematic timing diagram of modified reference clocks as generated in the PLL of FIG. 7D, in accordance with some embodiments. FIG. 7E shows that for each pulse in a normal bandwidth mode 720, three more pulses are generated in a wide bandwidth mode 718. It should be appreciated that more or less multiples of additional pulses in each reference clock $CK_{REF}$ and $CK_{MMD}$ may be used.

Referring back to FIG. 7D, in which reference unit 712 comprises a plurality of delay lines 714 that can generate multiple delayed copies of a single pulse in the input clock signals. The delay lines 714 are coupled to a multiplexer 716 which multiplexes the output of the delay lines into modified pulses REFi and MMDi to provide to the PFD.

Still referring to FIG. 7D, to stabilize the damping factor $\delta$, impedance $R_P$ may be adjusted to become $R_P/\alpha$, which may be accomplished by a switch 704 as described above in relation to FIG. 7A.

Some aspects are directed to configuring an amount of LO frequency shift for different RUs when multiple RUs are allocated within a frequency band.

Figure 8A:
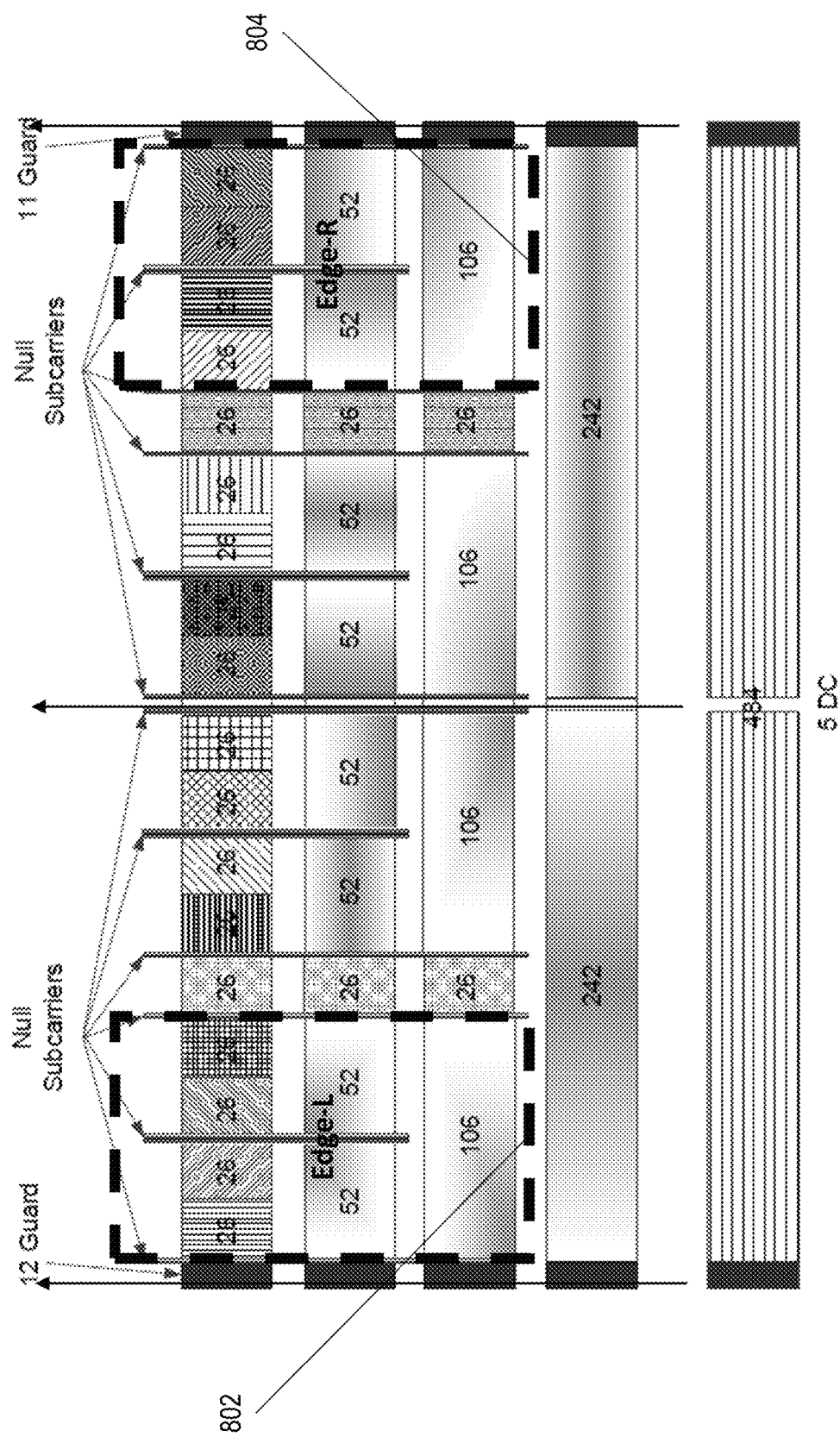
FIG. 8A is a schematic diagram illustrating a first embodiment of LO frequency shift configurations for different RU locations.

FIG. 8A is a schematic diagram illustrating a first embodiment of LO frequency shift configurations for different RU locations. FIG. 8A shows RU locations in a 40 MHz high efficiency (HE) PHY Protocol Data Unit (PPDU). In FIG. 8A, channels in the edge RUs within regions 802 (Edge-L) and 804 (Edge-R) may be configured to have shifted LO frequencies during TX operations to reduce unwanted emissions. The LO frequency shift amount $\delta f$ may have a magnitude of half of the data bandwidth (DBW) by the edge RUs, with a polarity of either plus or minus depending on the relative location of the LO frequency to the channel frequency.

Figure 8B:
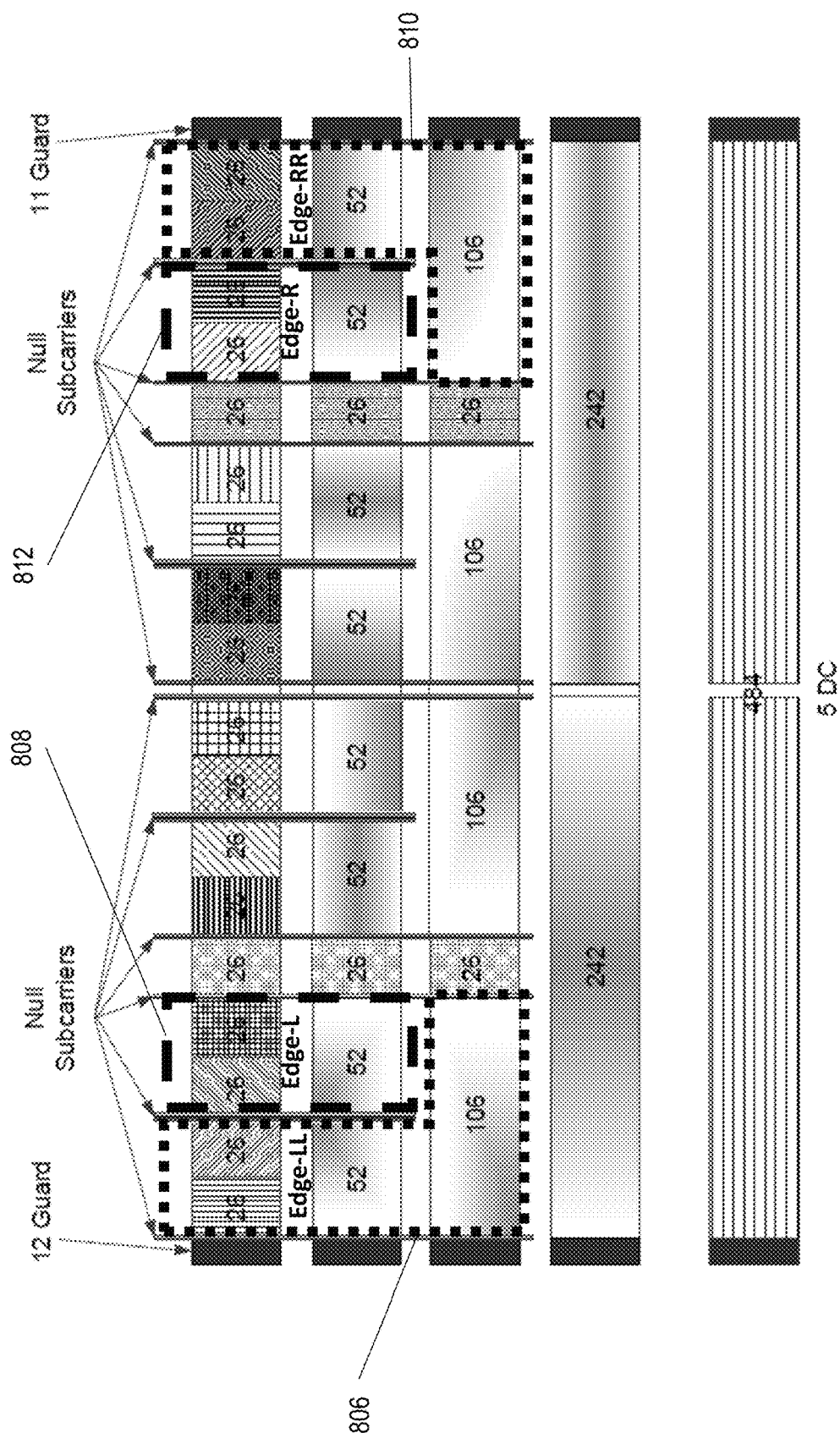
FIG. 8B is a schematic diagram illustrating a second embodiment of LO frequency shift configurations for different RU locations.

FIG. 8B is a schematic diagram illustrating a second embodiment of LO frequency shift configurations for different RU locations. FIG. 8B shows a variation of the configuration shown in FIG. 8A, and shows that different shift amounts are configured for different channels, for example between channels in regions 806 (Edge-LL), 808 (Edge-L), 810 (Edge-RR) and 812 (Edge-R). The LO frequency shift amount $\delta f$ may be plus or minus one half of DBW by the respective RU groups.

Figure 9:
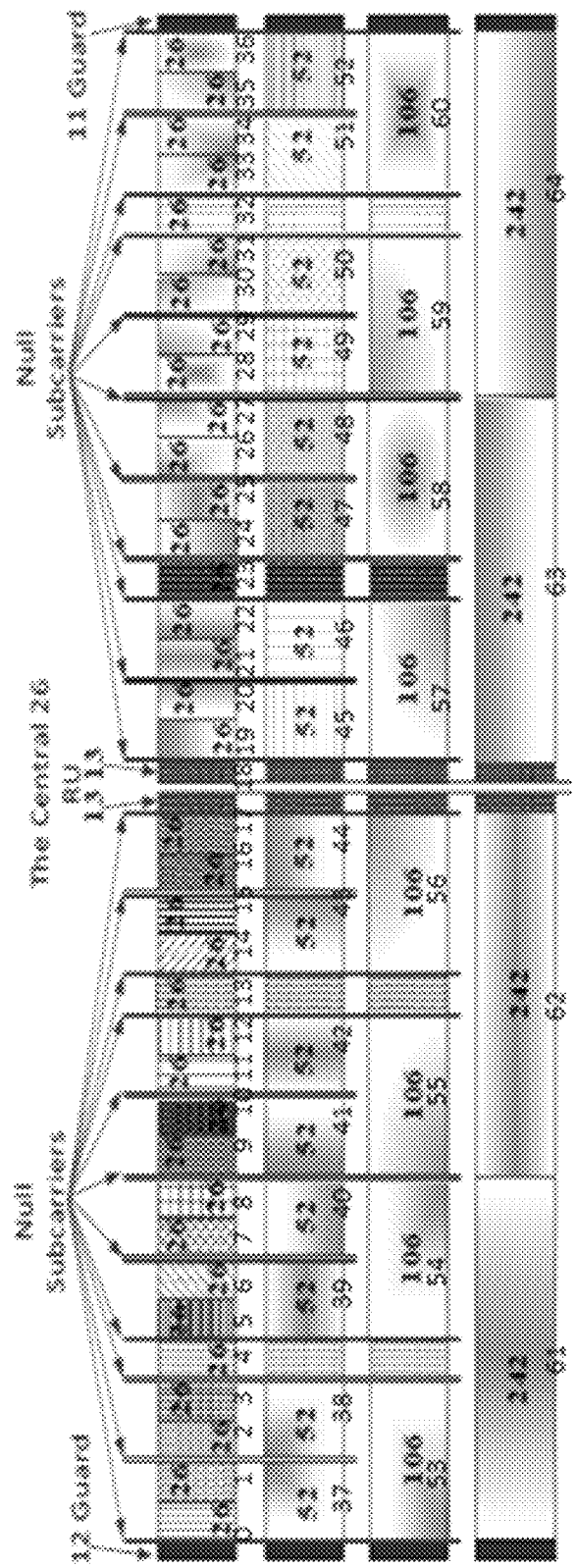
FIG. 9 is a schematic diagram illustrating RU allocations in a 40 MHz HE PPDU.

FIG. 9 is a schematic diagram illustrating RU allocations in a 40 MHz HE PPDU. In FIG. 9 is annotated with numerals 0-64 as reference numbers to each RU. Table 2 is a listing of TX LO frequency shift configuration for different channels and RUs as labeled in FIG. 9, in accordance with some embodiments. Table 3 is a listing summarizing grouping of RUs into groups of Edge_LL[0], Edge_LL[1], Edge_L[0], Edge_L[1], Edge_R[0], Edge_R[1], Edge_RR[0] and Edge_RR[1], where each group may be assigned a different amount of LO frequency shift, in accordance with some embodiments.

TABLE 2

| | Channel | Switch LO to +10 MHz | | Switch LO to −10 MHz | |
|---|---|---|---|---|---|
| HE20 | 2412 | 26-tone RU7, RU8 | 52-tone RU40 | | |
| | 2417 | 26-tone RU7, RU8 | 52-tone RU40 | | |
| | 2457 | | | 26-tone RU0, RU1 | 52-tone RU37 |
| | 2462 | | | 26-tone RU0, RU1 | 52-tone RU37 |

| | Channel | Switch LO to +20 MHz | | Switch LO to −20 MHz | |
|---|---|---|---|---|---|
| HE40 | 2422 | 26-tone RU14, 15, 16, 17 | 52-tone RU43, 44 | | |
| | 2427 | 26-tone RU14, 15, 16, 17 | 52-tone RU43, 44 | 26-tone RU0, 1 | 52-tone RU37 |
| | 2432 | 26-tone RU14, 15, 16, 17 | 52-tone RU43, 44 | 26-tone RU0, 1 | 52-tone RU37 |
| | 2437 | 26-tone RU16, 17 | 52-tone RU44 | 26-tone RU0, 1 | 52-tone RU37 |
| | 2442 | 26-tone RU16, 17 | 52-tone RU44 | 26-tone RU0, 1, 2, 3 | 52-tone RU37, 38 |
| | 2447 | | | 26-tone RU0, 1, 2, 3 | 52-tone RU37, 38 |
| | 2452 | | | 26-tone RU0, 1, 2, 3 | 52-tone RU37, 38 |

TABLE 3

| New RU grouping | Edge_LL[0] (group0_0) | Edge_LL[1] (group0_1) | Edge_L[0] (group1_0) | Edge_L[1] (group1_1) | Edge_R[0] (group3_0) | Edge_R[1] (group3_1) | Edge_RR[0] (group4_0) | Edge_RR[1] (group4_1) |
|---|---|---|---|---|---|---|---|---|
| BW20 | 0, 37, 53 | NA | 1 | NA | 7 | NA | 8, 40, 54 | NA |
| BW40 | 0, 1, 37, 53 | NA | 2, 3, 38 | NA | 14, 15, 43 | NA | 16, 17, 44, 56 | NA |
| BW80 | 0~6, 37~39, 53~4, 61 | NA | 7~12, 40~42, 55 | NA | 24~27, 47~48, 58 | NA | 28~36, 49~52, 59~60, 64 | NA |
| BW160NC/160 | 0~4, 37~38, 53, 61 | 0~4, 37~38, 53, 61 | 5~12, 39~42, 54-55 | 0~4, 37~38, 53, 61 | 24~27, 47~48, 58 | 0~4, 37~38, 53, 61 | 28~36, 49~52, 59~60, 64 | 0~4, 37~38, 53, 61 |

Figure 10:
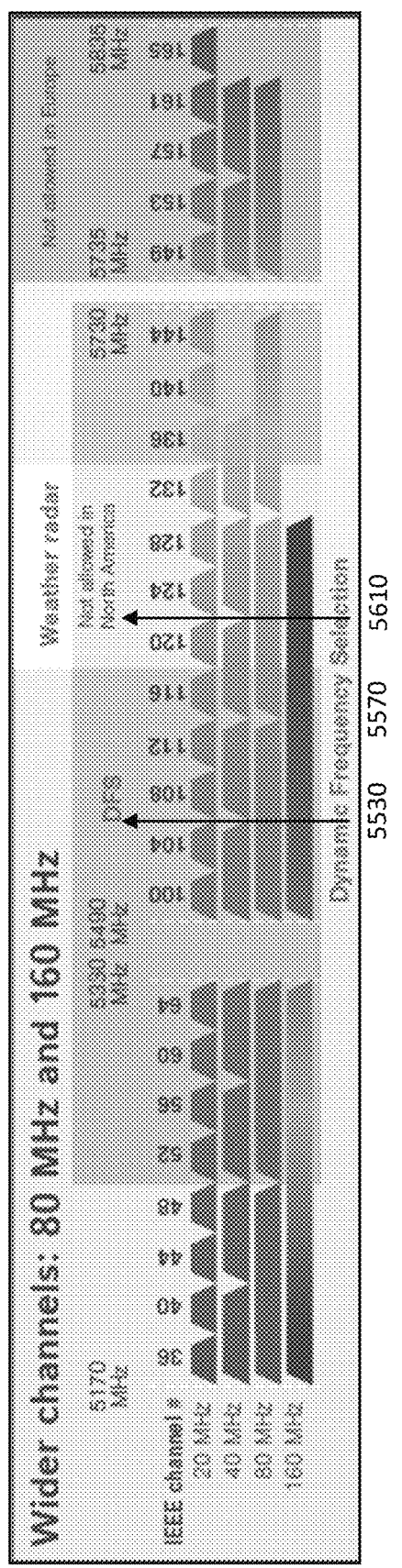
FIG. 10 is a schematic diagram illustrating channel allocations for wide 80 MHz and 160 MHz bandwidth.

FIG. 10 is a schematic diagram illustrating channel allocations for wide 80 MHz and 160 MHz bandwidth.

Figure 11:
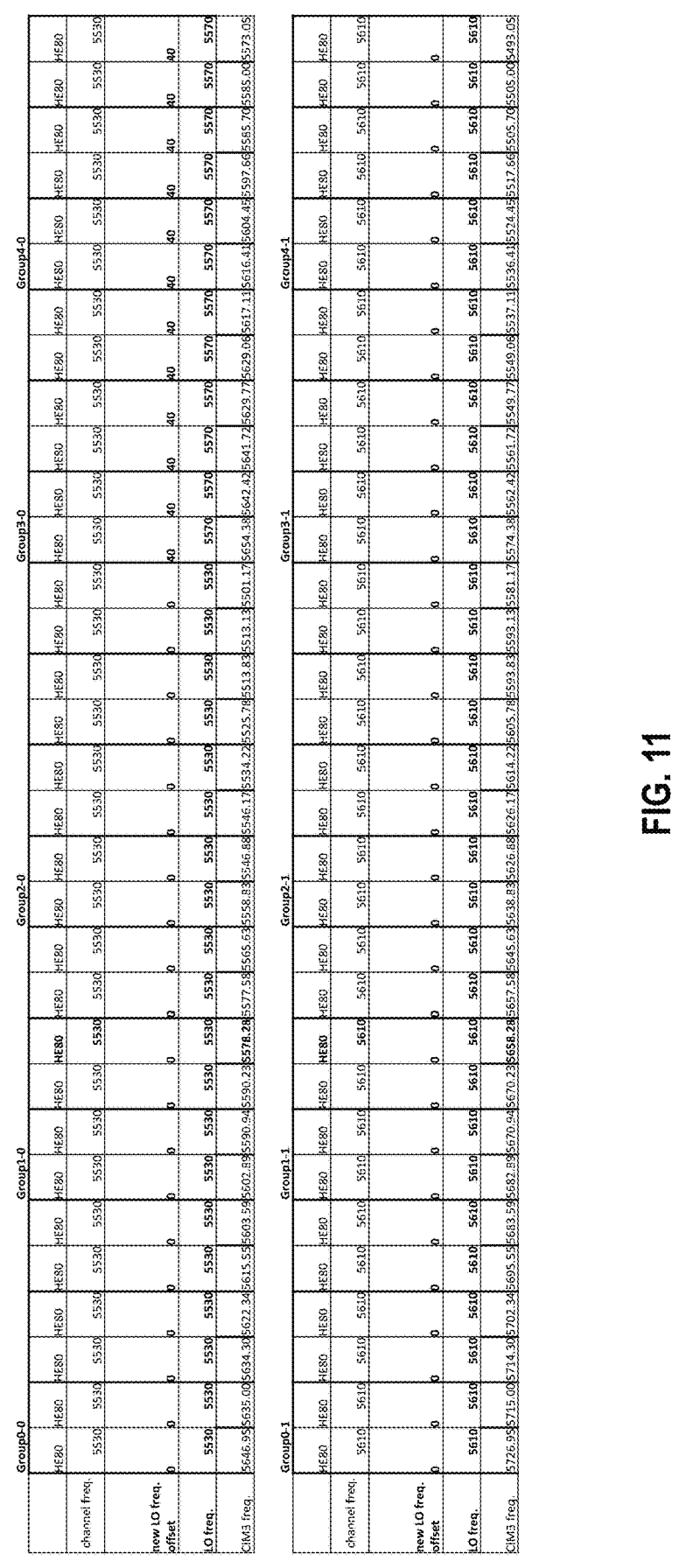

FIG. 11 is a listing of TX LO frequency shift or offset amount that can be configured for the channels allocated for 160 Hz bandwidth as shown in FIG. 10, in accordance with some embodiments.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method for operating a device for wireless communication in a plurality of allocated resource units (RUs) within a frequency band, the method comprising:
for one or more RUs of the plurality of RUs:
receiving a receive (RX) signal in the one or more RUs and demodulating the RX signal with a local oscillator (LO) signal;
changing a frequency of the LO signal; and
subsequent to changing the frequency of the LO signal, modulating a transmit (TX) data packet for transmission with the LO signal.

2. The method of claim 1, further comprising:
providing, with a phase-locked loop (PLL), the LO signal; and wherein changing the frequency of the LO signal comprises locking, with the PLL to a second LO frequency from a first LO frequency.

3. The method of claim 2, wherein locking to the second LO frequency from the first LO frequency is completed within a time duration of no more than 5 μs.

4. The method of claim 2, wherein the PLL comprises a phase-frequency detector (PFD), a voltage-controlled oscillator (VCO), and at least one charge pump coupled between the PFD and the VCO, and wherein changing the frequency of the LO signal comprises:
increasing a bandwidth of the PLL prior to changing the frequency of the LO signal.

5. The method of claim 4, wherein the VCO has an input terminal coupled to a reference voltage node via an impedance, and wherein changing the frequency of the LO signal further comprises:
adjusting a value of the impedance such that a damping ratio of the PLL is maintained.

6. The method of claim 4, wherein increasing the bandwidth of the PLL comprises increasing a magnitude of a charge pump current in the at least one charge pump.

7. The method of claim 4, the VCO has an input terminal coupled to a reference voltage node via a capacitance, and wherein increasing the bandwidth of the PLL comprises adjusting a magnitude of the capacitance.

8. The method of claim 4, wherein the PLL further comprises a divider coupled to the PFD, and wherein increasing the bandwidth of the PLL comprises adjusting a ratio N of the divider.

9. The method of claim 4, wherein the PLL is configured to provide one or more reference pulses to the PFD, and wherein increasing the bandwidth of the PLL comprises increasing a rate of pulses in the one or more reference pulses.

10. The method of claim 1, further comprising:
for each of the one or more RUs, determining an LO frequency shift amount based on the RU and the frequency band, wherein changing the frequency of the LO signal comprises changing the frequency of the LO signal by the LO frequency shift amount.

11. The method of claim 10, wherein the one or more RUs comprise a first RU and a second RU, wherein the first RU is closer to an edge of the frequency band than the second RU, and wherein a first LO frequency shift amount determined for the first RU is higher in magnitude than a second LO frequency shift amount determined for the second RU.

12. An apparatus for wirelessly transmitting a transmit (TX) signal during a TX period and wirelessly receiving a receive (RX) signal during a RX period, the apparatus comprising:
a phase-locked loop (PLL) configured to generate an oscillator (LO) signal; and
a controller coupled to the PLL and configured to change a frequency of the LO signal during a transition between the RX period and the TX period, wherein the RX signal is demodulated with the LO signal and the TX signal is modulated with the LO signal.

13. The apparatus of claim 12, wherein the PLL comprises:
a phase-frequency detector (PFD);
a voltage-controlled oscillator (VCO); and
at least one charge pump coupled between the PFD and the VCO, wherein:
the controller is further configured to increase a bandwidth of the PLL prior to changing the frequency of the LO signal.

14. The apparatus of claim 13, wherein the VCO has an input terminal coupled to a reference voltage node via a programmable impedance, and wherein
the controller is configured to adjust a value of the programmable impedance such that a damping ratio of the PLL is maintained.

15. The apparatus of claim 14, wherein the programmable impedance comprises a resistance and a switch that is coupled to the resistance.

16. The apparatus of claim 13, wherein the controller is further configured to increase a magnitude of a charge pump current in the at least one charge pump.

17. The apparatus of claim 13, wherein the VCO has an input terminal coupled to a reference voltage node via a programmable capacitance, and wherein the controller is configured to increase the bandwidth of the PLL by adjusting a magnitude of the programmable capacitance.

18. The apparatus of claim 17, wherein the programmable capacitance comprises a capacitor and a switch coupled to the capacitor.

19. The apparatus of claim 13, wherein the PLL further comprises a divider coupled to the PFD, and wherein the controller is configured to increase the bandwidth of the PLL by adjusting a ratio N of the divider.

20. The apparatus of claim 13, wherein the PLL further comprises a reference unit coupled to the PFD and configured to receive one or more reference pulses, and to generate one or more modified pulses based on the one or more reference pulses for the PFD, wherein the one or more modified pulses have a higher rate of pulses than the one or more reference pulses.

21. The apparatus of claim 20, wherein the reference unit comprises a plurality of delay lines configured to receive a reference pulse of the one or more reference pulses, and to generate a plurality of delayed reference pulses.

22. The apparatus of claim 21, wherein the reference unit further comprises a multiplexer coupled between the plurality of delay lines and the PFD, the multiplexer configured to combine the plurality of delayed reference pulses to generate a modified pulse.

23. The apparatus of claim 12, wherein the PLL is configured to change the frequency of the LO signal within a time duration of no more than 5 μs.

* * * * *